United States Patent
Theuss et al.

(10) Patent No.: US 9,978,720 B2
(45) Date of Patent: May 22, 2018

(54) INSULATED DIE

(71) Applicant: Infineon Technologies AG, Neubiberg (DE)

(72) Inventors: Horst Theuss, Wenzenbach (DE); Gottfried Beer, Nittendorf (DE); Juergen Hoegerl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/201,624

(22) Filed: Jul. 5, 2016

(65) Prior Publication Data
US 2017/0011982 A1 Jan. 12, 2017

(30) Foreign Application Priority Data

Jul. 6, 2015 (DE) .......... 10 2015 110 853
Dec. 18, 2015 (DE) .......... 10 2015 122 294

(51) Int. Cl.
*H01L 21/00* (2006.01)
*H01L 25/065* (2006.01)
(Continued)

(52) U.S. Cl.
CPC .......... *H01L 25/0657* (2013.01); *H01L 21/78* (2013.01); *H01L 23/3114* (2013.01); *H01L 23/3135* (2013.01); *H01L 23/3185* (2013.01); *H01L 23/5226* (2013.01); *H01L 24/19* (2013.01); *H01L 24/20* (2013.01); *H01L 24/96* (2013.01); *H01L 24/97* (2013.01); *H01L 21/561* (2013.01); *H01L 21/568* (2013.01); *H01L 25/0655* (2013.01); *H01L 2224/04042* (2013.01); *H01L 2224/04105* (2013.01); *H01L 2224/24137* (2013.01); *H01L 2224/32225* (2013.01); *H01L 2224/32245* (2013.01); *H01L 2224/48091* (2013.01); *H01L 2224/48137* (2013.01); *H01L 2224/48145* (2013.01); *H01L 2224/48227* (2013.01); *H01L 2224/48247* (2013.01); *H01L 2224/73265* (2013.01); *H01L 2224/73267* (2013.01); *H01L 2224/82039* (2013.01); *H01L 2224/92244* (2013.01); *H01L 2224/97* (2013.01); *H01L 2225/0651* (2013.01); *H01L 2225/06506* (2013.01); *H01L 2924/1032* (2013.01); *H01L 2924/1033* (2013.01); *H01L 2924/10252* (2013.01); *H01L 2924/10253* (2013.01); *H01L 2924/10272* (2013.01); *H01L 2924/14* (2013.01); *H01L 2924/1421* (2013.01);
(Continued)

(58) Field of Classification Search
CPC ... H01L 25/0657; H01L 23/3114; H01L 24/97
See application file for complete search history.

(56) References Cited

U.S. PATENT DOCUMENTS 9,013,013 B1 * 4/2015 Beer .................. G01L 19/0069
257/415
9,349,709 B2 * 5/2016 Hoegerl .............. H01L 25/0655
(Continued)

FOREIGN PATENT DOCUMENTS

WO       2005/048302 A2    5/2005
WO    WO 2005048302 A2 *   5/2005  .......... B81C 1/0023

*Primary Examiner* — Laura Menz

(57) ABSTRACT

An insulated chip comprising a semiconductor chip comprising at least one chip pad and an electrically insulating layer surrounding at least part of the semiconductor chip.

4 Claims, 11 Drawing Sheets

(51) Int. Cl.
*H01L 23/522* (2006.01)
*H01L 21/78* (2006.01)
*H01L 23/31* (2006.01)
*H01L 23/00* (2006.01)
*H01L 21/56* (2006.01)

(52) U.S. Cl.
CPC ............... *H01L 2924/1431* (2013.01); *H01L 2924/1461* (2013.01); *H01L 2924/15311* (2013.01); *H01L 2924/3511* (2013.01)

(56) References Cited

U.S. PATENT DOCUMENTS

| | | | |
|---|---|---|---|
| 2004/0155322 A1* | 8/2004 | Cho | H01L 23/3128 257/676 |
| 2008/0096321 A1* | 4/2008 | Lin | H01L 27/14618 438/113 |
| 2008/0258278 A1* | 10/2008 | Ramos | H01L 24/40 257/676 |
| 2009/0057885 A1* | 3/2009 | Theuss | B81C 1/0023 257/723 |
| 2014/0231971 A1* | 8/2014 | Theuss | H01L 21/56 257/659 |
| 2015/0059454 A1* | 3/2015 | Vaupel | H01L 23/3185 73/65.09 |
| 2015/0090030 A1* | 4/2015 | Theuss | H01L 23/04 73/431 |
| 2015/0101395 A1* | 4/2015 | Dehe | G01N 29/2418 73/24.02 |
| 2015/0155267 A1* | 6/2015 | Hoegerl | H01L 25/0655 257/698 |
| 2017/0011982 A1* | 1/2017 | Theuss | H01L 24/97 |

* cited by examiner

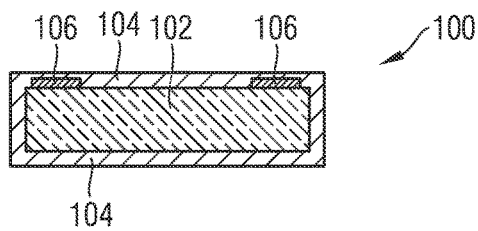
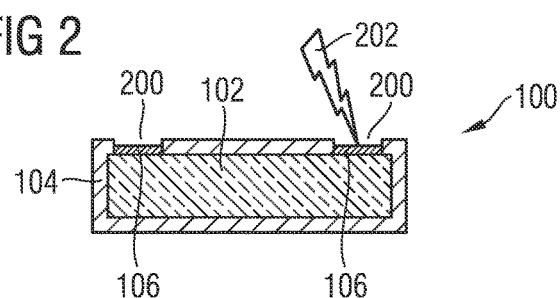
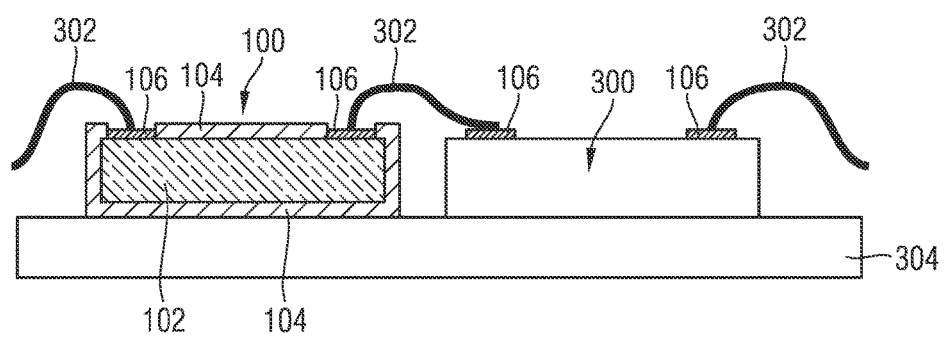
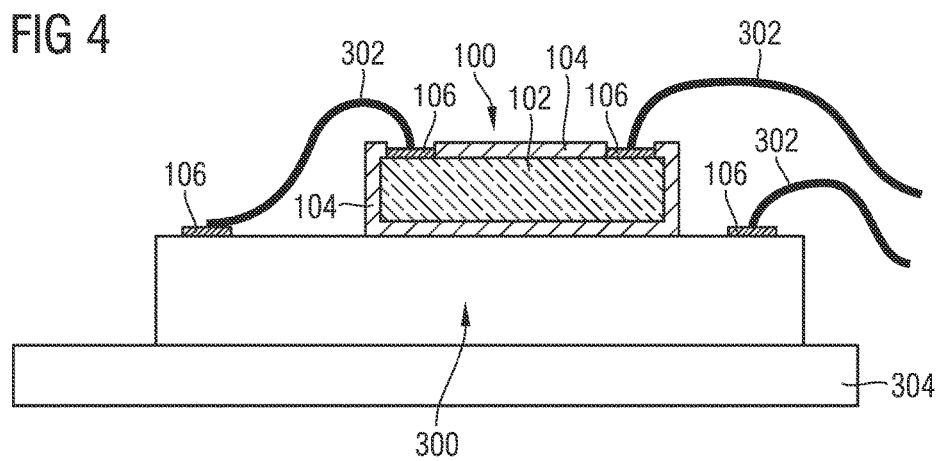

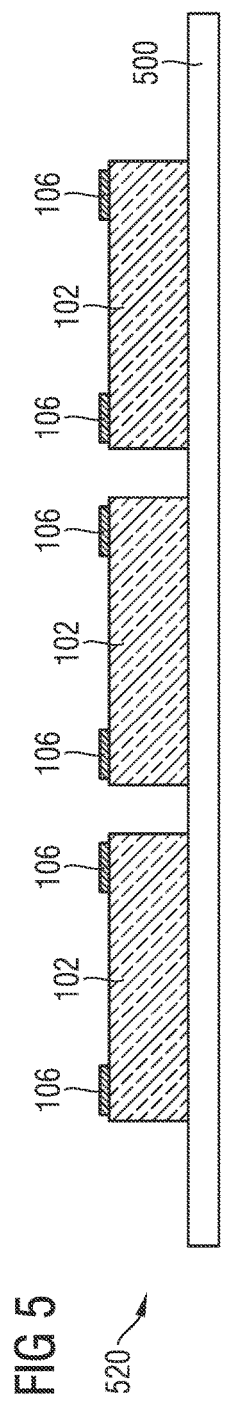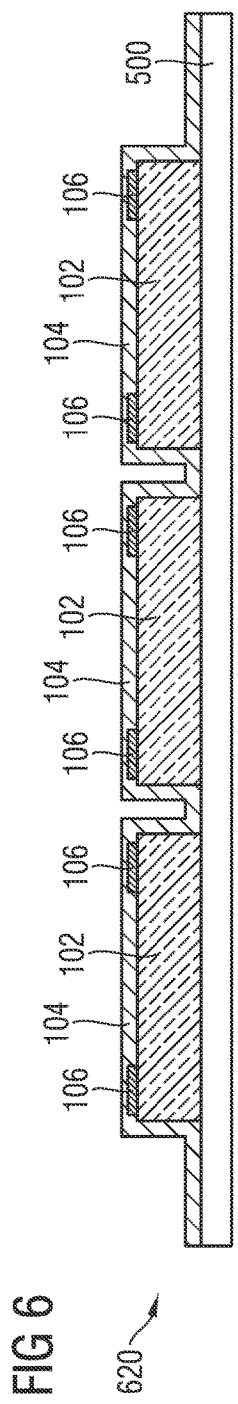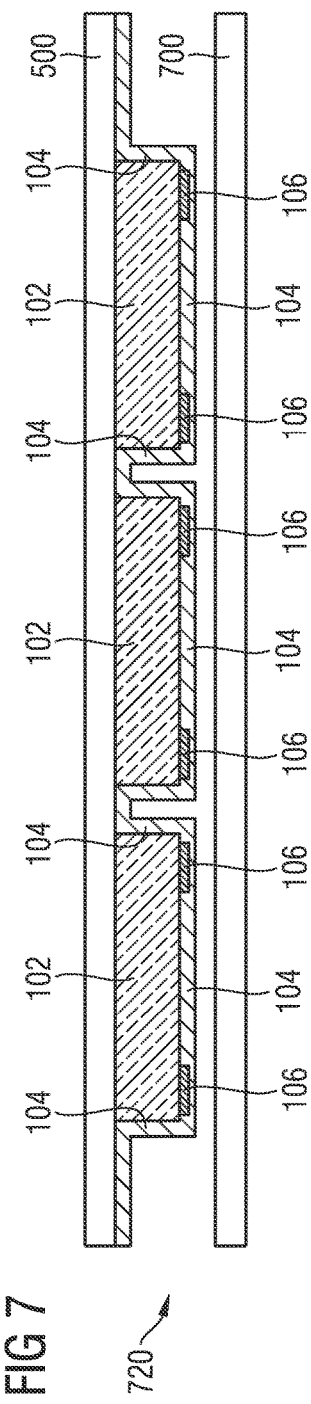

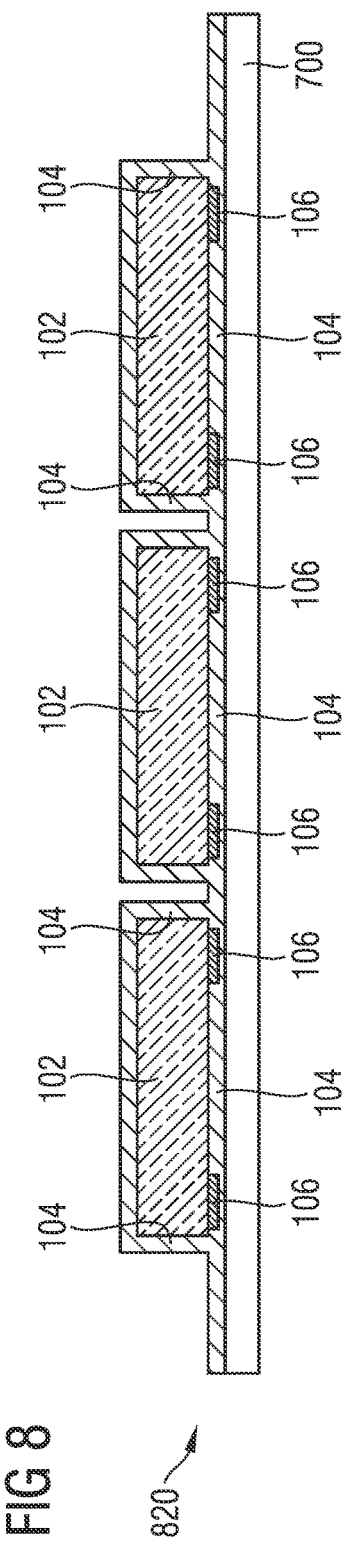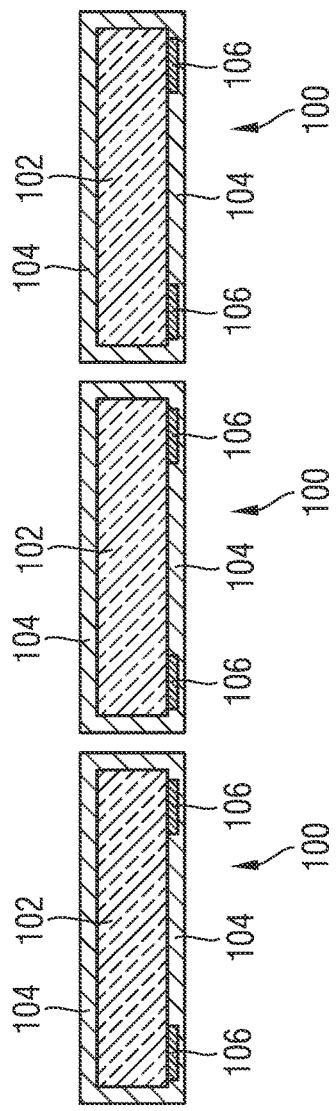

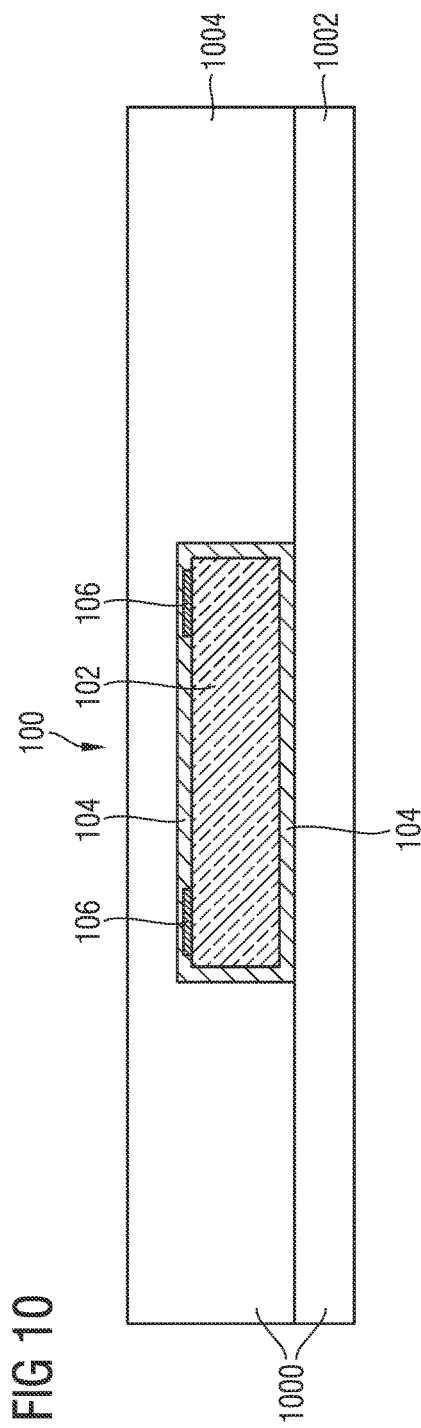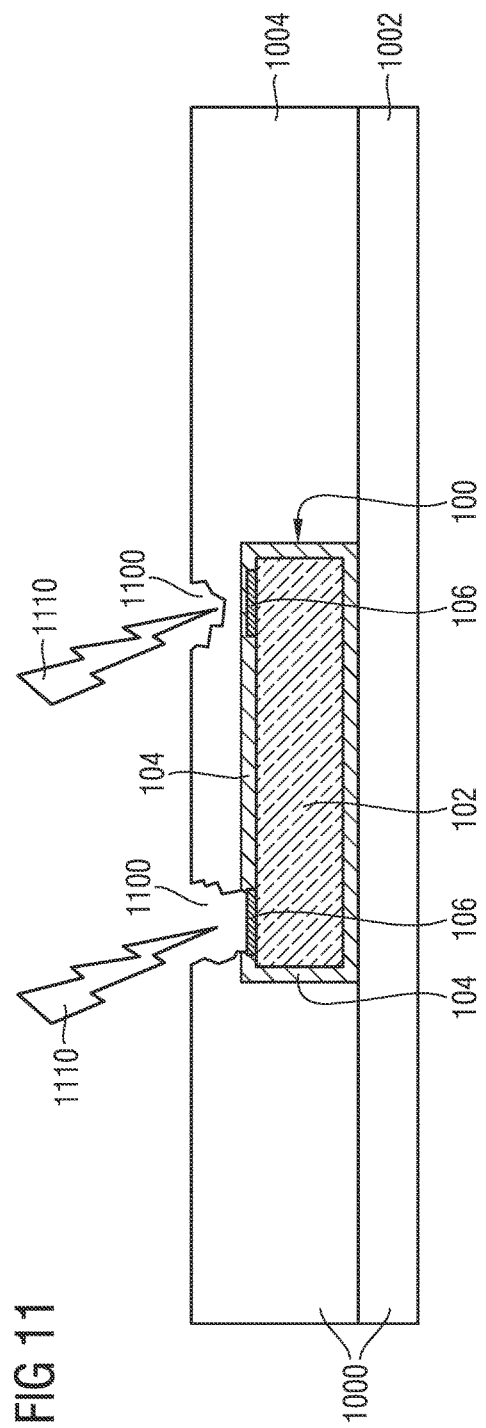

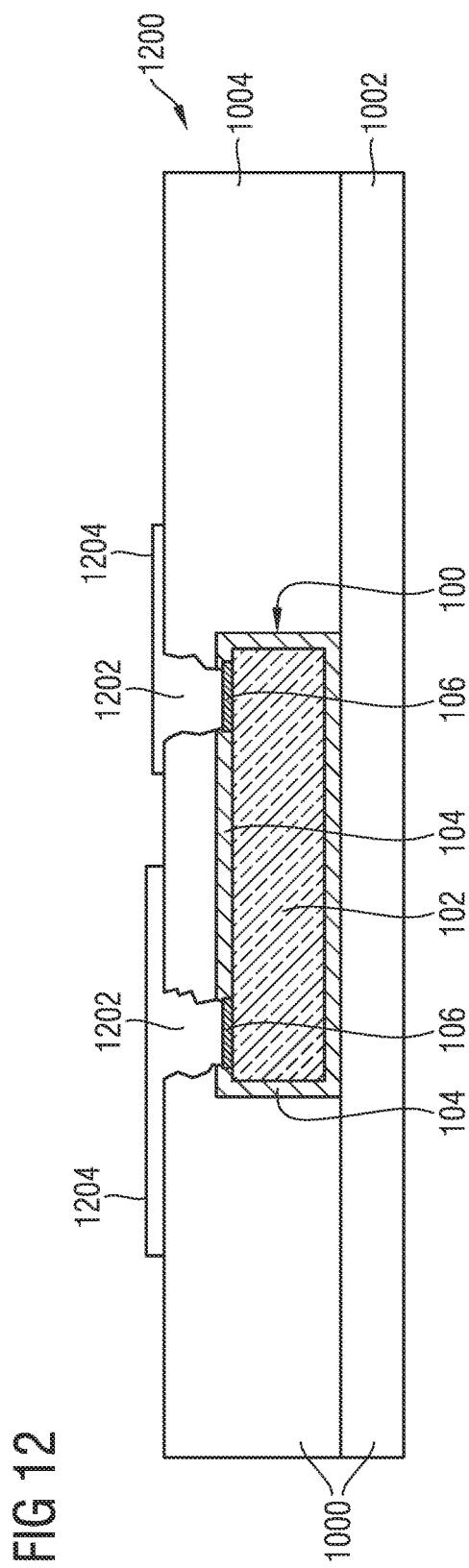

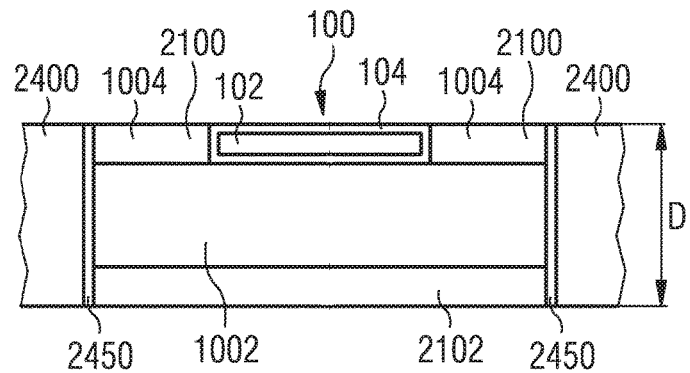
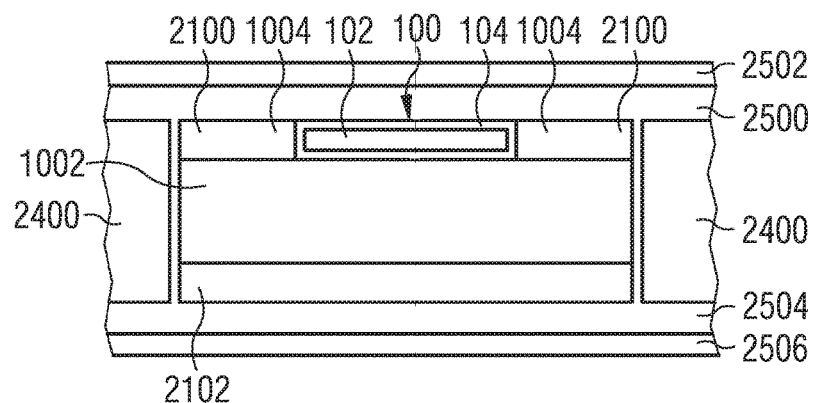
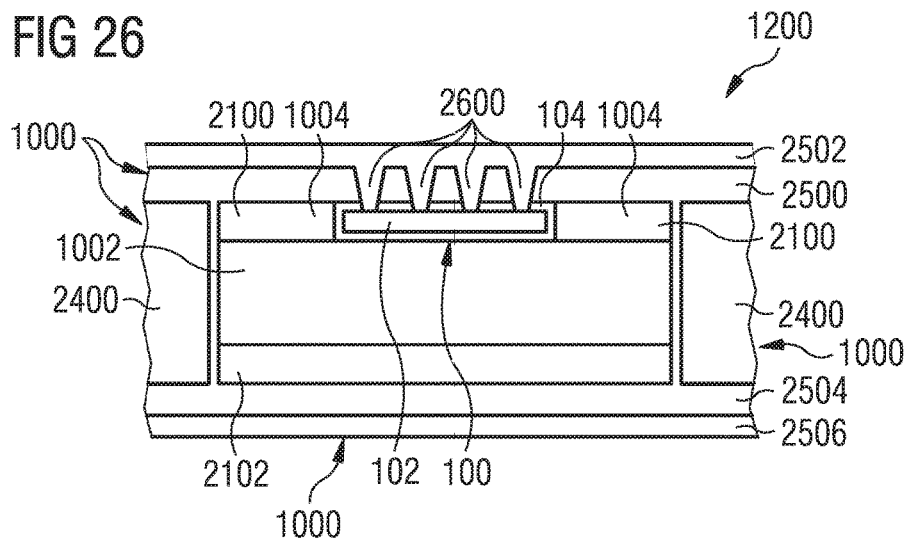

INSULATED DIE

BACKGROUND

Technical Field

Various embodiments relate generally to an insulated chip, packages, and methods of manufacturing packages.

Description of the Related Art

Packages may be denoted as encapsulated electronic chips with electrical connects extending out of the encapsulant and being mounted to an electronic periphery, for instance on a chip carrier such as a printed circuit board.

In particular electronic power packages, for instance half bridge circuits or current sensors, may comprise semiconductor chips which need to be mounted in an electrically insulated manner (in particular with regard to neighbored traces, other chips or other electric potentials in the environment). Conventionally, semiconductor chips are mounted on a mounting base via non-conductive glue body to provide an insulation of at least one metal pad on the semiconductor chip. Also a bulk encapsulant (for instance a mold or a laminate of a dielectric plastic material) may contribute to the electric insulation.

However, it is difficult to precisely adjust properties of such electrically insulating adhesive body (in particular in terms of dimensions, process stability, etc.). Additionally, many conventionally used adhesive materials have insufficient electrically insulating properties, in particular when a high disruptive strength is required. Consequently, conventional packages may suffer from the problem that undesired creep currents can flow, under undesired circumstances such as delamination, between an encapsulated electronic chip and another electrically conductive structure (such as another electronic chip, a trace, a via, etc.) of the package, which may deteriorate reliability of the package.

SUMMARY

There may be a need for a chip and a package with a chip which provide a high disruptive strength and a reliable protection against creep currents. Additionally or alternatively, there may be also a need for a chip and a package with a chip which are manufacturable by a robust and efficient manufacturing process and provide a reliable protection of the chip during processing.

According to an exemplary embodiment, an electrically insulated chip is provided which comprises a semiconductor chip (for instance a naked, unpackaged die singulated directly from a semiconductor wafer) comprising at least one chip pad (for instance a metallic chip pad) and an electrically insulating layer surrounding (in particular covering, more particularly covering in direct contact with semiconductor material of the semiconductor chip) at least part (in particular at least 60%, more particularly at least 90%, of an external surface) of the semiconductor chip.

According to another exemplary embodiment, a method of manufacturing an insulated chip is provided, wherein the method comprises providing a semiconductor chip comprising at least one chip pad, and surrounding (in particular coating, more particularly conformally coating) at least part of the semiconductor chip (in particular including side surfaces of the semiconductor chip) with an electrically insulating layer.

According to yet another exemplary embodiment, a package is provided which comprises an insulated chip having the above-mentioned features, and an encapsulant encapsulating at least part of the insulated chip (in particular covering at least part of the electrically insulating layer).

According to yet another exemplary embodiment, a method of manufacturing a package is provided, wherein the method comprises manufacturing an insulated chip by a method having the above-mentioned features, and encapsulating at least part of the insulated chip by an encapsulant.

According to yet another exemplary embodiment, a package is provided which comprises an insulated chip having the above-mentioned features, a further semiconductor chip (which may be configured as an insulated chip having the above-mentioned features, or as a packaged or non-packaged chip without electrically insulating layer), and at least one bond wire electrically connecting the insulated chip with the further semiconductor chip.

An exemplary embodiment has the advantage that a thin dielectric layer (rather than a bulk material) is applied onto the entire surface or at least onto a significant portion of the surface of the unpackaged semiconductor chip to provide for a very compact and reliable dielectric isolation within an encapsulation. By providing a dielectric shell directly contacting or covering the exterior semiconductor surface of the semiconductor chip, there is a high freedom to select the material of the electrically insulating layer for the purpose of a reliable electric insulation for suppressing creep current and increasing disruptive strength. A procedure of conformally applying this electrically insulating layer is precisely controllable and is compatible with a batch processing on wafer level. This architecture of electrically isolating a naked die also allows to provide for a reliable isolation of sidewalls and/or an active chip side of the semiconductor chip, thereby providing an efficient protection against undesired creep currents and voltage induced degradation along an interface between semiconductor chip and encapsulation (in particular in the event of delamination at this interface). Such parasitic phenomena, which are conventionally promoted by moisture, can be efficiently suppressed by the electrically insulating layer encasing the semiconductor chip.

Advantageously, a procedure of exposing one or more pads of the insulated chip for externally contacting the insulated chip by removing selected portions of material of the electrically insulating layer on the pad(s) can be accomplished simultaneously with the procedure of forming an access opening in an encapsulant in which the isolated chip is encapsulated. This allows to rapidly manufacture the electric contacting structure of the package.

The insulated chip and a corresponding package can be manufactured by a robust and efficient manufacturing process and provide a reliable protection of the chip during processing, in particular may protect the chip against damage by chemical and mechanical impact during the manufacturing process.

DESCRIPTION OF FURTHER EXEMPLARY EMBODIMENTS

In the following, further exemplary embodiments of the insulated chip, the packages and the methods will be explained.

In the context of the present application, the term "semiconductor chip" may particularly denote a naked die, i.e. a non-packaged (for instance non-molded) chip made of a processed semiconductor, for instance a singulated piece of a semiconductor wafer. One or more integrated circuit elements (such as a diode, a transistor, etc.) may be formed within the semiconductor chip.

In the context of the present application, the term "pad" may particularly denote an electrically conductive contact or terminal formed on a surface of the naked die which allows to electrically contact the one or more integrated circuit elements of the semiconductor chip. For example, a supply signal, a control signal or a data signal may be conducted from an electronic periphery into an interior of the package and into the semiconductor chip via the one or more pads. In a similar way, a supply signal, a control signal or a data signal may be conducted from the semiconductor chip to the electronic periphery via the one or more pads. The pads may be embodied as metallic islands on the die.

In the context of the present application, the term "electrically insulating layer" may particularly denote a thin film or a coating of a dielectric material covering a surface of the semiconductor chip (for example at least partially in direct contact with semiconductor material) and safely disabling any flow of electricity between an electronic periphery and the semiconductor chip through the electrically insulating layer. In particular, the thickness of such a layer may be in a range between 1 μm and 100 μm, in particular in a range between 5 μm and 50 μm. When the thickness falls significantly below 1 μm, electrical insulation and fluid tightness of the layer may become too low. If the thickness significantly exceeds 100 μm, costs may become too high, and limitations in terms of heat removal capability may occur.

In the context of the present application, the term "package" or module may particularly denote one or more semiconductor chips, optionally comprising one or more other kind of electronic components in addition, embedded within an encapsulant such as a mold or a laminate.

In an embodiment, an entire surrounding surface of the semiconductor chip and the at least one pad is covered with the electrically insulating layer. By taking this measure, a hermetically closed insulating chip is obtained which is shielded again electricity through the circumferentially closed dielectric film. In particular, also sidewalls and the active surface of the naked die may be protected in this embodiment.

In an embodiment, a surrounding surface of the semiconductor chip excluding only at least one surface portion around the at least one pad is covered with the electrically insulating layer. While sidewalls and a portion of the surface of the naked die may be completely protected against electricity in this embodiment, direct access to the chip pads is nevertheless enabled (for instance to couple the pads with bond wires).

In an embodiment, five substantially rectangular surfaces of a substantially cuboid semiconductor chip are covered with the electrically insulating layer, and a sixth substantially rectangular surface of the semiconductor chip is free of the electrically insulating layer. Such an insulated chip may be implemented advantageously in a chip encapsulating architecture based on an inverse cavity plating concept, for instance as described referring to FIG. 15 to FIG. 26. The sixth rectangular surface may be bonded on a mounting base such as a leadframe and/or may serve to provide for an electrically conductive connection.

In an embodiment, the electrically insulating layer is made of a polymer material, in particular parylene. Other polymer materials which may be implemented are polyimide or polyamide. Parylene, which is a preferred material in exemplary embodiments, denotes a variety of chemical vapor deposited poly(p-xylylene) polymers which may function as highly efficient moisture and dielectric barriers. Xylylene comprises two isomeric organic compounds with the formula $C_6H_4(CH_2)_2$. Parylene is particularly appropriate due to its combination of barrier properties and its capability to be processed. Parylene may be enriched with one or more additives to precisely adjust the desired material properties. Polymer materials, in particular parylene, may combine an excellent electric isolation with a capability of reliably filling and flowing into even very narrow gaps during deposition, thereby ensuring also a sealing task concerning moisture. Moreover, such materials can be precisely and rapidly removed by laser processing. It is possible to conformally deposit these material with homogeneous thickness from a gas phase. Furthermore, the mentioned materials, in particular parylene, provide a pronounced protection against corrosion.

In an embodiment, the electrically insulating layer is made of a material being removable by laser drilling to provide a defined and reproducible shape and dimension. By taking this measure, via formation by laser patterning on the one hand and exposing one or more chip pads of the insulated chip on the other hand may be carried out by a single combined laser processing procedure, and hence very efficiently.

In an embodiment, the semiconductor chip is a power semiconductor chip. Such power semiconductor chips are specifically prone to failure in the event of creep currents or disruptive discharge which may occur under high voltage or high current conditions. Power semiconductor chips may be used for automotive applications. Power semiconductor chips may comprise, as integrated circuit elements, power transistors and/or diodes.

In an embodiment of the manufacturing method, the process of surrounding or coating comprises mounting the semiconductor chip on an auxiliary carrier, and depositing a first part of the electrically insulating material on an exposed part of the surface of the mounted semiconductor chip. Such an auxiliary carrier may be a plate or foil on which one or a plurality of semiconductor chips to be coated may be arranged. After the coating procedure, the semiconductor chip(s) may be detached from the auxiliary carrier for further processing.

In an embodiment, the surrounding (or coating) further comprises mounting a surface portion of the semiconductor chip covered with the deposited electrically insulating material on a further auxiliary carrier, then removing the auxiliary carrier, and subsequently depositing a second part of the electrically insulating material on an exposed part of the surface of the mounted semiconductor chip which has been covered by the auxiliary carrier during depositing the first part of the electrically insulating material. In such a re-mounting concept, it is possible to detach the semiconductor chip(s) from the auxiliary carrier and to attach another (previously exposed) surface of the semiconductor chip(s) onto the further auxiliary carrier before a subsequent coating procedure. By taking this measure, it is possible to fully circumferentially deposit the layer of electrically insulating material on each and every surface portion of the semiconductor chip(s).

In an embodiment, the manufacturing method is carried out simultaneously with a plurality of semiconductor chips. Such a batch procedure allows for a very efficient processing.

In an embodiment, the electrically insulating layer is deposited from a gas phase, in particular by Chemical Vapor Deposition (CVD). This procedure allows to obtain a reliably uninterrupted homogeneously thick electrically insulating layer. However, alternative deposition procedures are possible, such as Physical Vapor Deposition (PVD), and Plasma Enhanced Physical Vapor Deposition (PECVD).

In an embodiment, the package comprises at least one electrically conductive via. Each via may extend through a respective common access hole extending through both the encapsulant and the electrically insulating layer. Thus, by a single via or other vertical interconnect element, it is possible to electrically penetrate both encapsulant and electrically conductive layer for getting access to the one or more chip pads.

In an embodiment, the encapsulant comprises a laminate, in particular a printed circuit board laminate. In the context of the present application, the term "laminate structure" may particularly denote an integral flat member formed by electrically conductive structures and/or electrically insulating structures which may be connected to one another by applying a pressing force. The connection by pressing may be optionally accompanied by the supply of thermal energy. Lamination may hence be denoted as the technique of manufacturing a composite material in multiple layers. A laminate can be permanently assembled by heat and/or pressure and/or welding and/or adhesives.

In another embodiment, the encapsulant comprises a mold, in particular a plastic mold. For instance, a correspondingly encapsulated chip may be provided by placing the insulated chip (if desired together with other components, such as a leadframe) between an upper mold die and a lower mold die and to inject liquid mold material therein. After solidification of the mold material, the package formed by the encapsulant with the insulated chip in between is completed.

In an embodiment, the encapsulant comprises a mounting base on which a bottom of the insulated chip is mounted and comprises a cover covering a top of the insulated chip. In particular, the mounting base may comprise an electrically conductive material (such as a metal sheet) and the cover may comprise a recessed or continuous electrically insulating material. For instance, a corresponding package or module may be denoted as BLADE package or module (compare FIG. 12 or FIG. 13).

In an embodiment, the cover comprises a lateral surrounding structure, in particular made of electrically conductive material, delimiting a cavity in which the insulated chip is embedded, in particular vertical in flush with the insulated chip. The lateral surrounding structure may be an annular body surrounding and accommodating the insulated chip. For instance, the lateral surrounding structure may be made of the same material as the mounting base and may be created after having mounted the insulated chip on the mounting base.

In an embodiment, the cover comprises at least one top layer covering a top surface of the insulated chip. Thus, encapsulation of the insulated chip, to which also the lateral surrounding structure contributes, may be completed by covering the insulated chip and the lateral surrounding structure by one or more planar layers, for instance connectable by lamination.

In an embodiment, the at least one top layer additionally covers a top surface of the lateral surrounding structure. When the one or more planar top layers are applied to the lateral surrounding structure and the insulated chip having the same vertical height, the connection procedure may be accomplished by lamination (i.e. by applying heat and pressure).

In an embodiment, the at least one top layer comprises a lower electrically insulating top layer directly covering the top surface of the insulated chip and being penetrated by at least one vertical interconnect structure providing for an electric connection with the at least one chip pad. By taking this measure, the lower electrically insulating top layer may ensure that the various chip pads remain electrically decoupled from one another. However, when forming one or more through holes extending through the lower electrically insulating top layer and filling these through holes with electrically conductive material, vertical interconnect structures such as vias can be formed. Highly advantageously, laser drilling for forming access holes as a basis for the vertical interconnect structures on the one hand and laser drilling for exposing one or more chip pads of the insulated chip on the other hand may be carried out by a simple and single combined and simultaneous procedure.

In an embodiment, the at least one top layer comprises an upper electrically conductive top layer directly covering the lower layer and being connected to the at least one vertical interconnect structure. The electrically conductive layer (for instance a copper foil) may be directly connected with the one or more vertical interconnect structures.

In an embodiment, a surface of the insulated chip being directly arranged on the mounting base is free of the electrically insulating layer and/or is electrically coupled to the mounting base. For instance, it may be connected and electrically coupled by soldering to the mounting base, for instance a leadframe.

In an embodiment, the lateral surrounding structure is made of an electrically conductive material and is laterally surrounded by an electrically insulating annular structure, in particular an electrically insulating annular structure being in flush (i.e. vertically aligned) with the lateral surrounding structure. Thus, the arrangement of insulated chip, laterally surrounding structure and mounting base may be arranged, in turn, in a cavity defined by a central recess of the annular structure.

In an embodiment, the package comprises a counter structure on a main surface of the mounting base opposing a further main surface of the mounting base on which the lateral surrounding structure is arranged. For example, the counter structure and the laterally surrounding structure may be formed in a common procedure and/or from the same material, for instance may be plated galvanically on opposing main surfaces of the mounting base. The provision of the counter structure provides for a more symmetric arrangement in the vertical direction, thereby suppressing bending and warpage of the package.

In an embodiment, the package comprises at least one bottom layer constituting a main surface of the package opposing a further main surface of the package constituted by the at least one top layer. The at least one bottom layer (for instance an electrically insulating bottom layer and an electrically conductive bottom layer) may be connected to the package during the same lamination procedure in which the at least one top layer is connected. The provision of the at least one bottom layer provides for a more symmetric arrangement in the vertical direction, thereby suppressing bending and warpage of the package.

In an embodiment, the electrically insulating layer is arranged for electrically insulating the semiconductor chip from at least one further semiconductor chip of the package and/or electrically conductive traces of the package and/or electrically conductive contacts of the package. By taking this measure, it may be dispensable to ensure that the further semiconductor chip(s), the electrically conductive trace(s) and/or the contact(s) are itself reliably insulated from the insulated chip, because this function is accomplished by the electrically insulating layer.

In an embodiment, the package further comprises a chip carrier, in particular a leadframe, carrying the insulated chip, and at least one bond wire electrically connecting the at least one chip pad with the chip carrier. Such an embodiment can be advantageously realized with an insulated chip in which the electrically insulating layer is interrupted solely at the chip pad portions because this simplifies attaching the bond wires thereto.

In an embodiment, the package is configured as one of the group consisting of a current sensor (in particular a current sensor based on magnetic sensing), a half bridge, a cascode circuit, a circuit constituted by a field effect transistor and a bipolar transistor being connected in parallel to one another, and a power semiconductor circuit. However, also other high current and/or high voltage and/or high power applications are compatible with the architecture of an insulated chip according to an exemplary embodiment of the invention.

In an embodiment, the method further comprises forming at least one common access hole extending through both the encapsulant and the electrically insulating layer in a single common procedure to thereby expose the at least one chip pad. According to such a highly preferred embodiment, a single hole formation procedure is sufficient to obtain access to the chip pads of the semiconductor chip being insulated by the (even hermetically closed) electrically insulating layer and a surrounding (for instance also electrically insulating) encapsulation. In other words, the access hole formation procedure may simultaneously form a hole in the (for instance hermetically sealed) electrically insulating layer and the encapsulant. In particular, the forming of the at least one common access hole comprises at least one of the group consisting of laser ablation, plasma processing, and chemically processing.

In an embodiment, the method comprises mounting the insulated chip on a mounting base, in particular on a planar mounting base (rather than being inserted into a cavity during mounting). This simplifies the mounting procedure, in particular in comparison to a scenario in which the insulated chip would have to be inserted into a recess or a cavity.

In an embodiment, the method comprises, after the mounting, forming a lateral surrounding structure, in particular made of the same material as the mounting base, delimiting a cavity in which the already mounted insulated chip is embedded, in particular vertical in flush with the insulated chip. Thus, the cavity circumferentially surrounding the insulated chip may be formed only after the mounting procedure, i.e. by an additive rather than by a subtractive procedure. This simplifies processing and increases reliability of the manufactured package.

In an embodiment, forming the lateral surrounding structure on the mounting base is accomplished by an additive procedure (for instance by material deposition), in particular by galvanically plating. When the mounting base is made of copper, for instance is a copper leadframe, galvanic deposition of material on this basis is enabled and is carried out for forming the laterally surrounding structure. This is a simple and very reliable procedure which does not harm the insulated chip. Its insulating layer protects the semiconductor chip in an interior of the insulated chip during such a galvanic plating procedure from interaction with chemicals.

In an embodiment, the method further comprises inserting the lateral surrounding structure and the insulated chip on the mounting base into a laterally surrounding annular structure (which may be made of electrically insulating material), in particular an annular structure being in flush with the lateral surrounding structure and the insulated chip. When the mentioned components are all in flush with one another, i.e. all at the same height level, subsequent connection of one or more additional layers by lamination is promoted and simplified.

In an embodiment, the method further comprises connecting at least one top layer to a top surface of the insulated chip and the laterally surrounding structure (and preferably an annular surrounding structure), in particular by laminating. Such a lamination procedure can be accomplished by applying heat and pressure.

In an embodiment, the method further comprises forming the at least one top layer with an electrically insulating top layer directly covering the top surface of the insulated chip, and forming at least one vertical interconnect structure vertically extending through the electrically insulating top layer and through the electrically insulating layer for providing an electric connection with the at least one chip pad. The insulating top layer in combination with the one or more vertical interconnect structures may hence fulfill two functions, i.e. encapsulating the insulated chip and defining one or more electric paths of signals propagating between an interior and an exterior of the package.

In an embodiment, forming at least one vertical interconnect structure comprises forming, in particular by laser drilling, at least one common access hole extending through both the electrically insulating top layer and the electrically insulating layer in a common procedure to thereby expose the at least one chip pad, and filling the at least one common access hole with electrically conductive material. This has significant advantages: On the one hand, two procedures may be combined into one. On the other hand, any potential registration problems between individual access holes for exposing chip pads and for defining vias are completely omitted.

In an embodiment, the method comprises manufacturing a plurality of packages at least partially in a batch procedure as a consecutive/a connected/an integral structure being subsequently singularized into the individual packages or preforms thereof. In particular, the procedures of forming the insulated chip, of mounting the insulated chip on the mounting base, and of forming the laterally surrounding structure may be performed efficiently for multiple packages in common or even on wafer level. After these procedures, the semifinished packages or preforms of packages may be singularized and may be then further processed. For further processing, the individualized elements may be inserted into an integral structure comprising multiple annular surrounding structures. Subsequently, layer formation and lamination as well as access hole formation and material deposition for formation of the vertical interconnect structures may be again carried out as a batch.

In an embodiment, the method further comprises filling, in particular at least partially galvanically, the at least one common access hole with electrically conductive material, in particular copper. This combines a safe electric contactability of the insulated chip with a high protection against undesired creep current or disruptive discharge and allows for a simple and quick processing.

In an embodiment, the method further comprises forming at least one electrically conductive layer structure on the encapsulant and electrically coupled to the electrically conductive material. Such an electrically conductive layer may be attached by lamination or may be deposited by a deposition procedure (such as sputtering).

In an embodiment, the package comprises a mounting base on which both the insulated chip and the further semiconductor chip are mounted separately from one another (in particular juxtaposed to one another with a gap in between on the mounting base). Hence, insulated chip and further semiconductor chip may be connected to one another in a side-by-side architecture, for example electrically connected by one or more bond wires.

In an embodiment, the insulated chip and the further semiconductor chip are mounted on one another (i.e. may be vertically stacked on top of each other). Hence, insulated chip and further semiconductor chip may be connected to one another in a chip-on-chip architecture, for example electrically connected via one or more bond wires.

The one or more electronic chips may be semiconductor chips, in particular dies. In an embodiment, the at least one electronic chip is configured as a power semiconductor chip, in particular comprising at least one of the group consisting of a diode, and a transistor, more particularly an insulated gate bipolar transistor. In an embodiment, the device is configured as a power module. For instance, the one or more electronic chips may be used as semiconductor chips for power applications for instance in the automotive field. In an embodiment, at least one electronic chip may comprise a logic IC or an electronic chip for RF power applications. In one embodiment, the electronic chip(s) may be used as one or more sensors or actuators in microelectromechanical systems (MEMS), for example as pressure sensors or acceleration sensors.

As substrate or wafer for the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 shows a cross-sectional view of an insulated chip being hermetically sealed, mechanically and electrically, by a direct coating of semiconductor and metallic surface material of the chip with an electrically insulating layer according to an exemplary embodiment.

FIG. 2 shows a cross-sectional view of an insulated chip with exposed pads, wherein all semiconductor surfaces of the chip are hermetically surrounded by an electrically insulating layer exposing only the pads according to an exemplary embodiment.

FIG. 3 shows a cross-sectional view of a semifinished package with semiconductor chips mounted side-by-side according to an exemplary embodiment before encapsulation.

FIG. 4 shows a cross-sectional view of a semifinished package with semiconductor chips mounted in a chip-on-chip architecture according to another exemplary embodiment before encapsulation.

FIG. 5 to FIG. 9 show structures obtained during carrying out a method of manufacturing a plurality of insulated chips in a batch architecture according to another exemplary embodiment.

FIG. 10 shows a semifinished package according to an exemplary embodiment before exposing chip pads by removing material of an encapsulant and of a hermetically sealing electrically insulating layer in a common procedure.

FIG. 11 shows the semifinished package of FIG. 10 after exposing chip pads by removing material of the encapsulant and of the electrically insulating layer in a common laser ablation procedure.

FIG. 12 shows a cross-sectional view of a package according to an exemplary embodiment obtained by the manufacturing method according to FIG. 10 and FIG. 11.

FIG. 15 to FIG. 26 show structures obtained during carrying out a method of manufacturing a plurality of packages in a batch architecture according to another exemplary embodiment.

DETAILED DESCRIPTION

Figure 13:
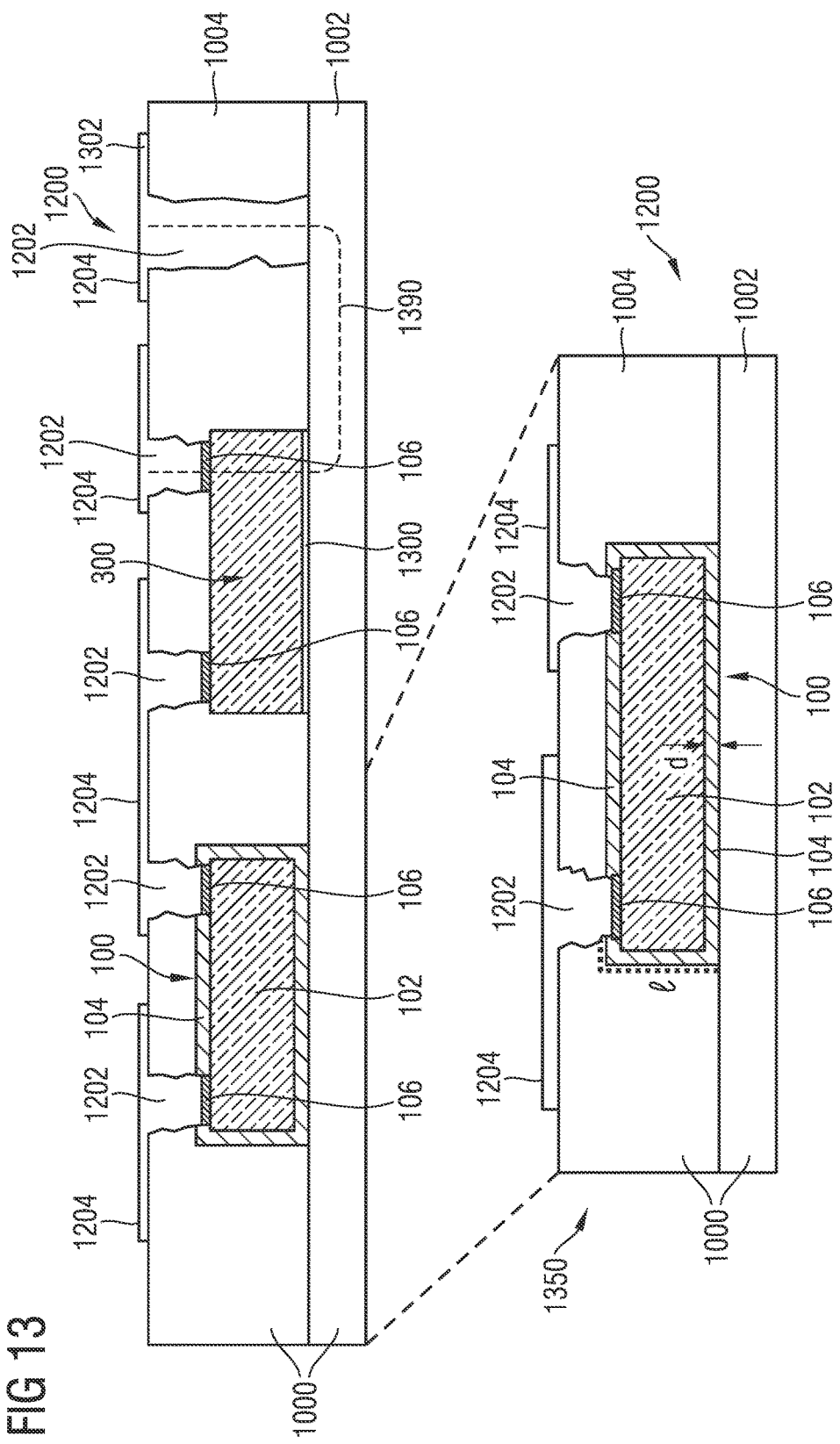
FIG. 13 shows a cross-sectional view of a package providing a half bridge function according to an exemplary embodiment of the invention.

The illustration in the drawing is schematically and not to scale.

Before exemplary embodiments will be described in more detail referring to the figures, some general considerations will be summarized based on which exemplary embodiments have been developed.

According to an exemplary embodiment, an isolated chip (for instance covered with a parylene layer or any other appropriate dielectric film) may be implemented in a package or module (such as a BLADE housing, i.e. laminated in a circuit board). In an embodiment, the insulation layer and thereby the chip pads are opened only during opening of an upper package layer or encapsulant (for instance by a laser procedure). The completed package then comprises a circumferentially fully isolated or hermetically insulated chip, with the only exception of the contact pad(s).

Such an architecture allows for a defined and reliable insulation of chip and chip surfaces. This also protects the package from undesired creep currents and voltage induced degradation along the interface chip-encapsulation (for instance plastic encapsulation), in particular in the scenario of delamination at this interface (for instance under the influence of moisture).

According to an exemplary embodiment of the invention, this can be achieved by a full surface coverage of the semiconductor chip by the electrically insulating layer (in particular from parylene), wherein an obtained insulating chip may be embedded within a package (such as an embedding in a printed circuit board or in a BLADE package). Advantageously, exposure of the contact pads of the chip to the encapsulant and the electrically insulating layer is accomplished in a single common procedure (for instance by laser ablation, in which the same laser beam penetrates firstly a part of the encapsulant and then the electrically insulating layer).

The described architecture can be implemented in very different package concepts, such as a BLADE package (compare FIG. 10 to FIG. 12), an embedded chip in a PCB, a chip embedded in a plastic encapsulation, etc. Advantageously, opening of a package up to the chip pads can be accomplished by processes such as laser ablation. A parylene coated semiconductor chip can be implemented in each standard package, for example in a side-by-side configuration (see FIG. 3) or in a stacked configuration (see FIG. 4), with a wire bond architecture (see FIG. 14), with a clip architecture, with a flip chip architecture, etc.

With such a packaging technology, it is for example possible to realize half bridge circuits in power electronics in which an electric isolation between neighbored chips, signal pads between neighbored chips (for instance with clips or wire bonds) is accomplished, while providing for a defined electric connection.

With the described concept, it is also possible to realize current sensors on the basis of magnetic sensors. For this purpose, an electric isolation between the sensor chip and the electrically conductive trace carrying a current to be measured is advantageous.

More generally, the described packaging technology is compatible with each package architecture in which at least one semiconductor chip shall be reliably isolated with regard to the environment (such as neighbored chips and/or traces and/or contacts).

According to another exemplary embodiment of the invention, an insulated chip as described above may be implemented advantageously in a chip embedding concept based on an inverse cavity formation architecture.

Conventional approaches of mounting semiconductor chips on a mounting base provide an annular structure delimiting a cavity on the mounting base, and mount the semiconductor chip subsequently in a respective cavity. Such a cavity has the function to compensate the chip height or chip volume in order to avoid glass fibers or the like to come into contact with the chip edge during mounting which could cause reliability issues. However, accurate manufacture of the cavity and a precise mounting of the chip on the mounting base and in the cavity are both cumbersome and involve reliability issues in terms of die attach quality.

In contrast to this and to overcome the mentioned shortcomings, die attach can be carried out according to an exemplary embodiment on a planar copper surface and before formation of the annular surrounding structure. The latter is only formed after mounting of the insulated chip and then delimits a chip accommodation cavity without inaccuracies. This is more simple in terms of processing and apparatus effort, and is more efficiency, safer and cheaper. A gist of an exemplary embodiment is to carry out die attach first and to perform copper deposition for cavity formation thereafter. A corresponding embodiment is shown in FIG. 15 to FIG. 26.

In order to prevent a semiconductor chip from electric, chemical and/or mechanical deterioration or damage and for passivating and isolating the semiconductor chip from an electrolysis bath and other chemicals used for forming the lateral surrounding structure, it can be covered for instance on five of six surfaces thereof with the dielectric and protecting insulating layer. For example, this can be accomplished after sawing and expanding on a saw foil. Preferably, the backside of the semiconductor chip is protected by saw foil and will not be covered. On the backside of the chip, it is possible to provide a further solderable or sinterable backside (such as a multilayer arrangement with a silver structure) or a reservoir of diffusion solder material (such as AuSn, SnAg).

A leadframe may be used as mounting base. Such a leadframe may be untreated and may have a surface of low and homogeneous roughness depth (for instance may be rolled with a maximum roughness depth of 400 nm) and may be free of disturbing oxides (for example anti-tarnish layer, for instance benzotriazole) and organic contaminants. On this surface, die attach can be carried out. After the die attach, the chip is still protected on five of six surfaces by the insulating layer. The backside is electrically conductively connected to the mounting base or leadframe by the die attach medium and is also protected. Afterwards, material deposition (in particular copper deposition) can be carried out until the chip is circumferentially completely embedded in the deposited material and remains only unencapsulated on its top. The protecting insulating layer prevents advantageously any undesired direct contact between the surface/sidewalls of the semiconductor chip on the one hand and a chemical (such as a copper electrolyte) used during the deposition procedure on the other hand. Consequently, an efficient protection against mechanical and chemical damage is provided. On the sidewalls it further functions as mechanical buffer between semiconductor material (such as silicon) and deposited copper. Since a gate pad and an emitter pad, for instance, are additionally isolated from one another and protected by the protecting insulating layer, any electrostatic discharge damage during and after copper deposition can be safely prevented.

After the plating of the (already chip carrying) plate-like (for example copper) mounting base for the formation of the laterally surrounding structure, the mounting base can be further processed and patterned for completing the packaging procedure. This may involve placing the formed arrangement into an annular surrounding structure in particular in a way to obtain a structure with a planar top surface to provide a proper basis for a subsequent lamination of one or more layers on one or both opposing main surfaces of the arrangement. Highly advantageously, the dielectric protection layer surrounding a major surface portion of the semiconductor chip may be configured so that a laser beam used for drilling access holes in one or more of the lamination layers for laser via formation can also locally remove part of the protecting insulating layer together with material of the laminate layer(s) thereon. Thus, there is substantially no additional effort for exposing the chip pads of the insulated chip. A particularly appropriate material for the mentioned purpose is parylene. As an alternative to parylene, it is possible to use another dielectric material which can be properly deposited, has a high disruptive strength and robustness against diffusion.

Advantages of the described embodiment are a robust processing during die attach and the possibility to use well-known procedures for package formation. Furthermore, the process is significantly more tolerant with regard to inaccuracies and tolerances of the plated copper layer thickness (the chip edges are protected by the protecting insulating layer). Furthermore, the chip surface is protected during a roughing procedure of the mounting base (such as a leadframe), which roughening procedure is advantageous for improving adhesion of the laminate. This allows the use of a thinner copper layer on the front side, which reduces costs and increases compactness.

As an alternative to copper, it is also possible to use copper alloys or a different material (such as nickel, iron, aluminum, etc.) for deposition. Apart from the described copper plate as mounting base, it is also possible to use other materials (such as metallic sheets like coated molybdenum, laminates, etc.), in particular as a basis for a subsequent plating procedure.

According to an exemplary embodiment of the invention, a protection layer is deposited on surfaces (for instance on five of six sides) of an semiconductor chip for preventing the latter with regard to mechanical and in particular chemical damage. The material of this protection layer can be configured to be patternable by a laser. Advantageously, the protection layer may be used as a barrier and buffer around a chip in order to embed the latter after the mounting on a carrier circumferentially with a plated layer (for instance functioning similar as a quasi-plating resist). Such features may be implemented in a procedure described below in detail referring to FIG. 15 to FIG. 26.

FIG. 1 shows a cross-sectional view of an electrically hermetically sealed insulated chip 100 being hermetically surrounded by an electrically insulating layer 104 according to an exemplary embodiment.

The insulated chip 100 comprises a semiconductor chip 102, for instance a power semiconductor chip comprising a transistor or a diode for a half bridge. The semiconductor chip 102 is a naked, unpackaged semiconductor chip consisting of a silicon body having an integrated circuit therein and having chip pads 106. The semiconductor chip 102 can be directly obtained from singulating (for instance sawing) a processed semiconductor wafer. An electrically insulating layer 104, embodied as a conformally deposited thin film of dielectric material such as parylene, continuously and fully circumferentially coats the entire surrounding surface of the semiconductor chip 102 with homogenous thickness and without interruption. In other words, an entire exterior surface of the semiconductor chip 102, including the pads 106, is covered with the electrically insulating layer 104. Thus, a flow of electricity between an exterior and an interior of the insulated chip 100 is disabled by the dielectric shell or wall hermetically sealing the semiconductor chip 102 with regard to an electronic periphery.

Hence, the insulated chip 100 has an external surface which is continuously covered with a continuous uniform film of the electrically insulating layer 104. Preferably, the thin film of the electrically insulating polymer is deposited on the unpackaged semiconductor chip 102 equipped with the pads 106 by Chemical Vapor Deposition (CVD). Hence, FIG. 1 shows a semiconductor die completely covered with an isolation layer, preferably parylene.

The insulated chip 100 can be embedded in an encapsulant, and an access hole can be formed through the encapsulant and the electrically insulating layer 104 in a common procedure (see FIG. 11) to thereby open the electrically insulating layer 104 selectively at and limited to the positions of the chip pads 106.

The insulated chip 100 shown in FIG. 1 can be used in particular also for the following processing path: The fully insulated chip 100 according to FIG. 1 can be mounted on a chip carrier (for instance by die bonding). Only directly before forming access contacts to the insulated chip 100 (for instance by wire bonding or clip bonding) the electric contact pads 106 of the insulated chip 100 are opened by selectively removing material of the electrically insulating layer 104 covering the pads 106 (for instance by laser ablation).

FIG. 2 shows a cross-sectional view of an insulated chip 100 according to an exemplary embodiment with exposed pads 106. The entire semiconductor surface of semiconductor chip 102 is hermetically covered by electrically insulating layer 104. In other words, the entire exterior surface of the insulated chip 100 is formed by the electrically insulating layer 104, wherein the pads 106 form the only exception by also contributing to the exterior surface of the insulated chip 100.

Hence, the difference between the insulated chip 100 according to FIG. 2 and the insulated chip 100 according to FIG. 1 is that, according to FIG. 2, access holes 200 are formed by laser ablation (see reference numeral 202) to remove material of the electrically insulating layer 104 selectively at the positions of the chip pads 106. In other words, the electrically insulating layer 104 is interrupted only at the positions of the chip pads 106 while fully covering the entire semiconductor surface of the semiconductor chip 102. Thus, a surrounding surface of the semiconductor chip 102 excluding only the surface portions defined by the pads 106 is covered with the electrically insulating layer 104. Therefore, FIG. 2 shows a semiconductor die covered with an isolation layer, but having contacts opened (for instance by laser ablation) so that the insulated chip 100 according to FIG. 2 can be directly further processed by wire bonding (see FIG. 3 and FIG. 4).

In the configuration of FIG. 2, the electric contact pads 106 of the insulated chip 100 have been opened (for instance by laser ablation, plasma processing, or chemically) so that the insulated chip 100 according to FIG. 2 can be used as a basis for very different mounting procedures such as wire bonding (compare FIG. 3, FIG. 4 or FIG. 14), flip chip processing, clip processing, etc. The insulated chip 100 according to FIG. 2 can be implemented in many different packaging architectures, such as BGA (Ball Grid Array), QFN (Quad Flat No Leads Package), QFP (Quad Flat Package), SOT (Small Outline Transistor), etc. The insulated chip 100 can form the basis of a single chip package or a multichip package. Exemplary embodiments of the invention may also be implemented in terms of ISOFACE technology (in particular to provide galvanic isolated high side switches and input integrated circuits).

FIG. 3 shows a cross-sectional view of a semifinished package with semiconductor chips 102, 300 mounted side-by-side according to an exemplary embodiment before encapsulation.

The semifinished (since not yet encapsulated) package shown in FIG. 3 comprises the insulated chip 100 according to FIG. 2, a further semiconductor chip 300 (in the shown embodiment a naked die without electrically insulating layer 104), and bond wires 302 electrically connecting an exposed pad 106 of the insulated chip 100 with a pad 106 of the further semiconductor chip 102. FIG. 3 furthermore shows that further pads 106 of the insulated chip 100 and of the further semiconductor chip 300 can be connected by further bond wires 302 to an electronic environment (not shown).

The semifinished package according to FIG. 3 additionally comprises a mounting base 304 (i.e. any substrate or chip carrier, for example a leadframe or an organic substrate) on which both the insulated chip 100 and the further semiconductor chip 300 are mounted in a side-by-side architecture with wirebond interconnection.

Figure 14:
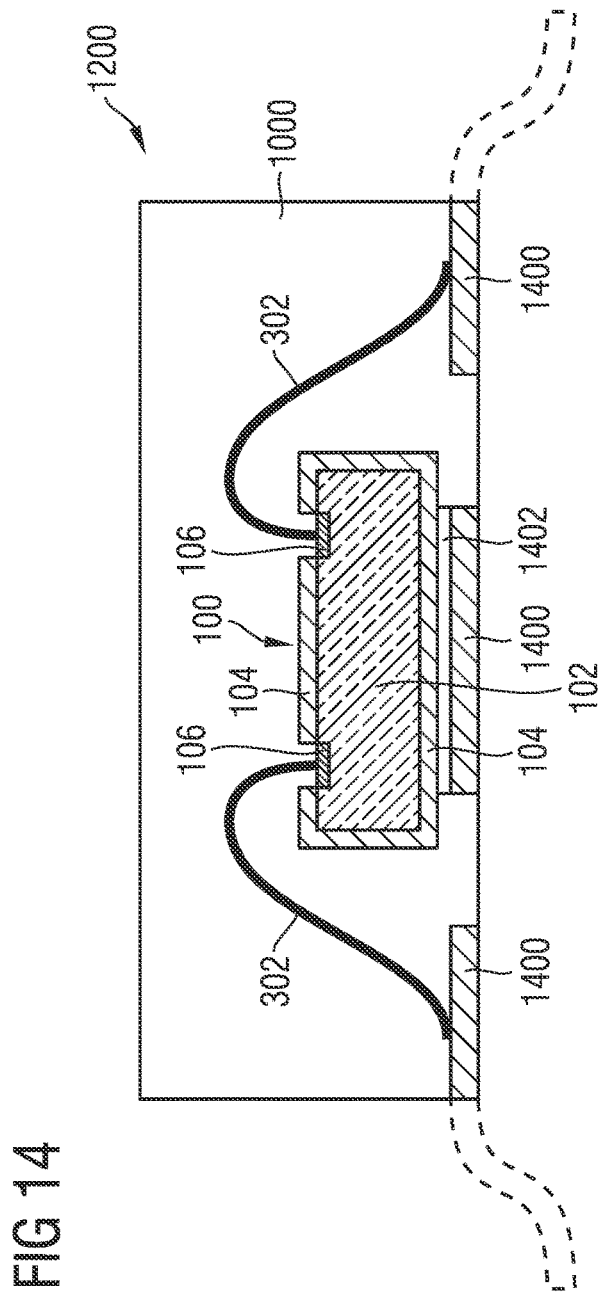
FIG. 14 shows a cross-sectional view of a package according to yet another exemplary embodiment of the invention.

To obtain a package according to an exemplary embodiment based on the semifinished package according to FIG. 3, the semifinished package can be encapsulated (for embedding insulated chip 100 and further semiconductor chip 300), for instance by lamination (as shown in FIG. 13) or by molding (as shown in FIG. 14). After encapsulation, the electrically insulating layer 104 provides for a reliable electric decoupling between the insulated chip 100 and the further semiconductor chip 300.

FIG. 4 shows a cross-sectional view of a semifinished package with semiconductor chips 102, 300 mounted in a chip-on-chip architecture according to another exemplary embodiment before encapsulation.

In contrast to FIG. 3, the embodiment of FIG. 4 shows a configuration in which the further semiconductor chip 300 is mounted on the mounting base 304, and the insulated chip 100 is mounted, in turn, on the further semiconductor chip 102. The electrically insulating layer 104 provides for a reliable electric decoupling between the directly connected arrangement of the insulated chip 100 and the further semiconductor chip 300 in the shown stacked die configuration.

To obtain a package according to an exemplary embodiment based on the semifinished package according to FIG. 4, the semifinished package can be encapsulated (for embedding insulated chip 100 and further semiconductor chip 300), for instance by lamination (as shown in FIG. 13) or by molding (as shown in FIG. 14). After encapsulation, the electrically insulating layer 104 provides for a reliable electric decoupling between the insulated chip 100 and the further semiconductor chip 300.

FIG. 5 to FIG. 9 show structures obtained during carrying out a method of manufacturing a plurality of insulated chips 100 in a batch architecture according to another exemplary embodiment. The goal of the described method is to simultaneously manufacture a plurality of insulated chips 100 according to FIG. 1.

In order to obtain a structure 520 shown in FIG. 5, a plurality of naked semiconductor chips 102 is mounted or placed on an auxiliary carrier 500. Thus, the semiconductor chips 102 are mounted, after dicing from a semiconductor wafer, on the auxiliary carrier 500 which can be a dicing foil.

In order to obtain a structure 620 shown in FIG. 6, a first part of the electrically insulating material, which later forms part of the electrically insulating layer 104, is deposited on an exposed part of the surface of all mounted semiconductor chips 102 simultaneously. This deposition procedure can be accomplished by a CVD process by which electrically insulating material such as parylene is deposited from the gas phase on exposed surfaces of the semiconductor chips 102 and of the auxiliary carrier 500.

In order to obtain a structure 720 shown in FIG. 7, the structure 620 is flipped or pivoted by 180°, to thereby attach (according to FIG. 6 upper) surfaces of the semiconductor chips 102 already covered with the electrically insulating material on a further auxiliary carrier 700. This procedure can be denoted as a re-lamination. In other word, surface portions of the semiconductor chips 102 covered with the previously deposited electrically insulating material are mounted on the further auxiliary carrier 700. Thus, a flipping of the dice is performed for re-lamination onto the further auxiliary carrier 700 (for instance a foil or any other carrier) in order to prepare the structure 720 for subsequent backside coating. After the described attachment, the auxiliary carrier 500 is removed from the semiconductor chips 102, to thereby expose the (according to FIG. 7 upper) surface portions of the semiconductor chips 102 which have previously been covered by the auxiliary carrier 500.

In order to obtain a structure 820 shown in FIG. 8, a second part of the electrically insulating material, later forming the electrically insulating layer 104, is deposited on a now exposed part of the surface of the mounted semiconductor chips 102 which had been covered by the auxiliary carrier 500 during depositing the first part of the electrically insulating material. Hence, coating of the backside of the semiconductor chips 102 is carried out, so that finally the whole surface of the semiconductor chips 102 (including pads 106) is encapsulated with a layer type electrically insulating layer 104.

In order to obtain the batch of hermetically sealingly insulated chips 100 shown in FIG. 9, the further auxiliary carrier 700 is detached or removed from the insulated chips 100. Thus, the described method is carried out simultaneously with the plurality of semiconductor chips 102, thereby producing a large number of semiconductor chips 102 in a quick and simple procedure carried out on wafer level after singularization (for instance sawing).

Modifications of the process flow described referring to FIG. 5 to FIG. 9 are of course possible. For instance, it is possible to start the deposition on the backside of the semiconductor chips 102, or to carry out a part of the deposition (for instance on one surface and side surfaces) without relamination.

FIG. 10 shows a semifinished package according to an exemplary embodiment before exposing chip pads 106 (by removing material of an encapsulant 1000 and of electrically insulating layer 104 in a common procedure).

For manufacturing the semifinished package according to FIG. 10, one insulated chip 100 (for instance manufactured according to FIG. 5 to FIG. 9) is encapsulated by an encapsulant 1000. In the shown embodiment, the encapsulant 1000 is a laminate composed of a mounting base 1002 (on which a bottom of the insulated chip 100 is mounted) and of a cover 1004 (covering a top of the insulated chip 100). The mounting base 1002 can be made of an electrically conductive material (for instance a copper sheet, for example having a thickness of about 200 μm). The cover 1004 can be made of an electrically insulating material (for instance a prepreg foil with or without preformed cavity for accommodating the insulated chip 100). The insulated chip 100 may be mounted on the mounting base 1002, for instance by gluing or soldering. The semiconductor chip 102 may have a (according to FIG. 10 vertical) thickness in a range between 30 μm and 200 μm, for instance 60 μm. The mounting base 1000, the insulated chip 100 and the cover 1004 can be connected to one another by lamination, i.e. by pressing them together supported by heat.

Therefore, the insulated chip 100 can be embedded into a laminate (for instance in terms of a PCB process or a BLADE process).

FIG. 11 shows the semifinished package of FIG. 10 after exposing chip pads 106 by removing material of encapsulant 1000 and of electrically insulating layer 104 in a common procedure.

Thus, common access holes 1100 are formed by laser ablation (see reference numeral 1110) to extend through both the encapsulant 1000 and the electrically insulating layer 104. In other words, the access holes 1100 are formed in a common procedure to thereby expose the chip pads 106. Highly advantageously, opening of encapsulant 1000 and electrically insulating layer 104 is accomplished in the same process, here with the same laser beam. This combines a highly reliable electric insulation of the semiconductor chip 102 with a simple and quick accessibility of the chip pads 106.

FIG. 12 shows a cross-sectional view of a package 1200 according to an exemplary embodiment obtained by the manufacturing method according to FIG. 10 and FIG. 11.

In order to obtain the package 1200 based on the semifinished package of FIG. 11, the common access holes 1100 are filled (for instance using a galvanic process) with electrically conductive material to thereby manufacture vias 1202 contacting the pads 106 in the access holes 1100. Furthermore, a patterned electrically conductive layer 1204 (such as a patterned copper foil) is formed as a surface wiring on the (on the surface dielectric) encapsulant 1000 and electrically coupled to the electrically conductive material forming the vias 1202. The, via filling and formation of conductor lines completes the manufacturing procedure of the package 1200.

In the configuration according to FIG. 12, the electrically insulating layer 104 is arranged for electrically insulating the semiconductor chip 102 from one or more possible further semiconductor chips (not shown) of the package 1200, electrically conductive layer 1204, and one or more possible electrically conductive contacts (not shown) of the package 1200. This ensures a reliable electric decoupling of the semiconductor chip 102 from the electronic periphery and therefore an efficient protection against creep currents and disruptive discharge. This is particularly advantageous when the package 1200 is configured for high current or high voltage applications such as a current sensor application based on magnetic sensing, a half bridge application, etc.

In terms of a BLADE process, the full-layer-encapsulated insulated chip 100 can be adhered onto the electrically conductive mounting base 1002 (such as a leadframe or a printed circuit board) and can be laminated with the cover 1004 (such as printed circuit board material). By laser processing, contacts in form of the access holes 1110 are shot into the encapsulant 1000 to thereby expose the chip pads 106. The access holes 1110 can be galvanically filled with electrically conductive material such as copper.

A highly advantageous effect of such an embodiment is that this access hole formation procedure simultaneously removes material of the encapsulant 1000 and the electrically insulating layer 104, in particular exclusively and exactly at the positions required for obtaining access to the chip pads 106. The resulting package 1200 then comprises the fully embedded semiconductor chip 102 which, apart from its chip pads 106, is completely electrically insulated with regard to the environment.

Further advantageously, the access hole formation as a basis for the upper chip metallization can be preferably carried out so that the laser automatically stops on the metallization (i.e. the chip pads 106) after forming the openings in the electrically insulating material of the electrically insulating layer 104 and the cover 1004. For this purpose, copper as material for the chip pads 106 is highly appropriate.

FIG. 13 shows a cross-sectional view of a package 1200 according to another exemplary embodiment of the invention.

The package 1200 provides an electronic half bridge function. In this embodiment, the insulated chip 100 and a conventional naked semiconductor chip 300 are both embedded in the encapsulant 1000. For example, the insulated chip 100 may be glued to the mounting base 1002, whereas the semiconductor chip 300 may be assembled on the mounting base 1002 using an electrically conductive interconnect 1300. The mounting base 1002 may for instance be a base substrate such as a metal foil or sheet. The mounting base 1002 may also be a current carrying rail in the case of a current sensor based on magnetic field sensing. A ground contact is denoted with reference numeral 1302 in FIG. 13. A detail 1350 of FIG. 13 shows an enlarged view of the surrounding of the insulated chip 100. As can be taken from detail 1350, a safe creepage distance, l, is achieved, even if the cover 1004 delaminates from the electrically insulating layer 104. A save isolation distance, d, is defined by the thickness (for instance 10 µm) of the electrically insulating layer 104.

Although not shown in the figures, a top surface or the package 1200 according to FIG. 13 can be mounted on a printed circuit board (PCB), for instance via solder balls (not shown).

A possible current flow path during operation of the package 1200 according to FIG. 13 is indicated with reference numeral 1390 and extends from the electrically conductive layer 1204 at the top surface, through one of the vias 1202, along the electrically conductive mounting base 1002, via the conductive interconnect 1300, through the further semiconductor chip 300, through another one of the vias 1202, and back to another portion of the electrically conductive layer 1204 at the top surface. Thus, the electrically conductive mounting base 1002 may contribute to the current flow and may simultaneously function as a heatsink for removing heat generated by the chips 100, 300 during operation of the package 1200.

FIG. 14 shows a cross-sectional view of a package 1200 according to yet another exemplary embodiment of the invention. The package 1200 shows an example of a wire bond architecture by which the insulated chip 100 according to FIG. 2 is embedded in a mold compound as encapsulant 1000.

According to FIG. 14, the package 1200 further comprises a chip carrier 1400 embodied as a leadframe which carries the insulated chip 100. The insulated chip 100 is mounted on the chip carrier 1400 by an adhesive material 1402. Bond wires 302 are provided for electrically connecting a respective one of the chip pads 106 with a respective lead of the chip carrier 1400.

The described arrangement is then inserted between a lower mold die and an upper mold die (not shown). Liquid mold material is introduced into the chamber defined between the lower mold die and the upper mold die and is solidified. Consequently, encapsulant 1000 is obtained in the form of a mold compound encapsulating the insulated chip 100, the bond wire 302, and part of the chip carrier 1400.

In one configuration, the package 1200 according to FIG. 14 has leads of the lead frame 1400 on the left-hand side and on the right-hand side of the package 1200 which are in flush with sidewalls of the encapsulant 1000. Such a configuration can be implemented in accordance with QFN (Quad Flat No Lead) packaging technology.

In another configuration, the package 1200 according to FIG. 14 has leads of the lead frame 1400 on the left-hand side and on the right-hand side of the package 1200 which laterally extend beyond sidewalls of the encapsulant 1000, thereby forming free terminals of gull-wing shape shown as dotted lines according to FIG. 14. Such a configuration can be implemented in accordance with SO (Small Outline) or QFP packaging technology.

FIG. 15 to FIG. 26 show structures obtained during carrying out a method of manufacturing a plurality of packages 1200 in a batch architecture according to another exemplary embodiment of the invention.

Figure 15:
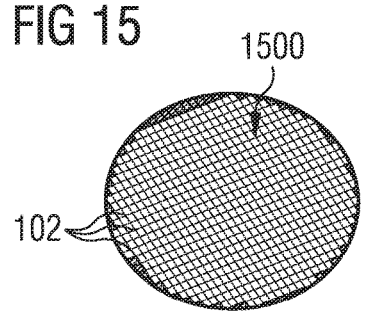

The structure shown in FIG. 15 is a processed semiconductor wafer 1500 comprising a plurality of semiconductor chips 102 with integrated circuit elements (such as SFETs or IGBTs, not shown).

Figure 16:
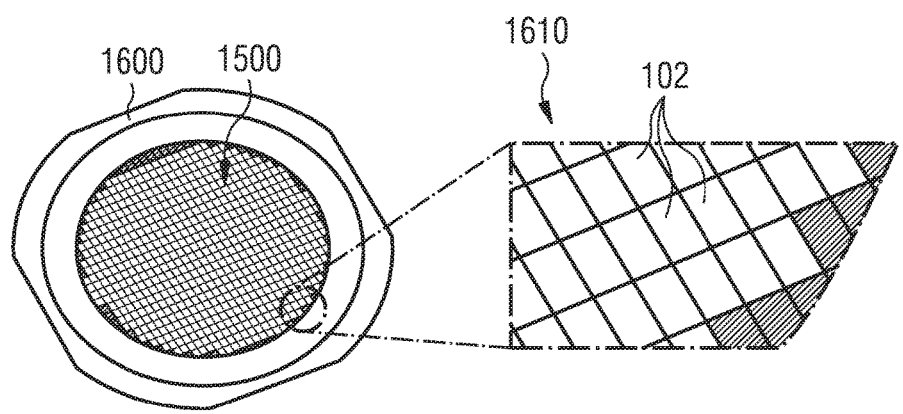

In order to obtain a structure shown in FIG. 16, the semiconductor wafer 1500 is thinned and sawn on a saw frame (see reference numeral 1600). As can be taken from a detail 1610, the semiconductor wafer 1500 comprises a plurality of semiconductor chips 102 arranged in rows and columns.

Figure 17:
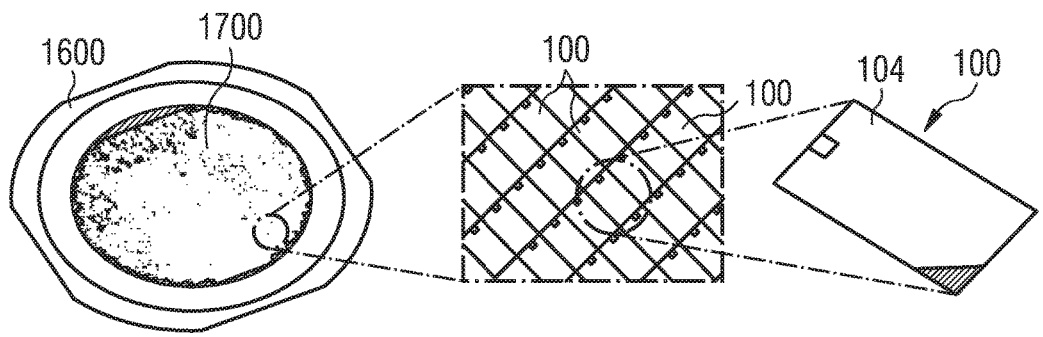

In order to obtain a structure shown in FIG. 17, the semiconductor wafer 1500 as shown in FIG. 16 is made subject to a coating procedure for forming the electrically insulating layer 104 on all exposed surfaces of all semiconductor chips 102. Thereby, a dielectric coated semiconductor wafer 1700 is obtained.

In order to enable coating material to be deposited reliably on the entire upper main surface and the four vertical side surfaces of the sawn semiconductor chips 102 still being attached with their lower main surfaces on a flexible foil, the sawn semiconductor wafer 1700 can be expanded during the coating procedure. This can be accomplished by correspondingly bending the flexible foil to increase the spacing between adjacent semiconductor chips 102 during the coating procedure. This may prevent undesired shading effects and may therefore reduce the risk of incomplete coating of the five mentioned surfaces of the semiconductor chips 102 to be coated.

Subsequently, the individually formed insulating chips 100 are released from the flexible foil and are further processed as shown in the following figures.

Figure 18:
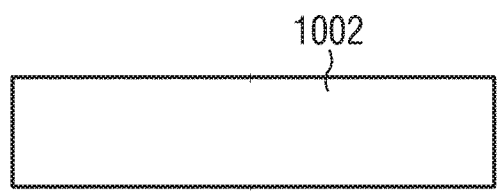

In order to obtain a structure shown in FIG. 18, a mounting base 1002 provided, such as a planar or rolled copper sheet or a leadframe.

Figure 19:
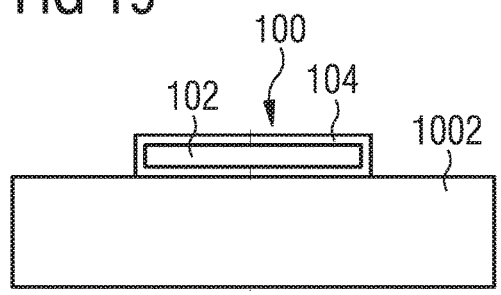

In order to obtain a structure shown in FIG. 19, the insulated chip 100, as obtained according to FIG. 17, is mounted directly on the planar mounting base 1002. In view of the planarity of the mounting base 1002, this is a very simple procedure. In other words, the mounting base 1002 is advantageously initially free of any cavities which are only formed thereafter by an additive process (compare FIG. 21). This has the significant advantage that the remarkable effort for manufacturing cavities with high reliability by a subtractive procedure (in particular involving lithography) can be omitted.

Still referring to a FIG. 19, five substantially rectangular surfaces of the substantially cuboid semiconductor chip 102 are fully covered with the electrically insulating layer 104. Only a sixth substantially rectangular surface of the semiconductor chip 102, more specifically arranged as the bottom surface according to FIG. 19, is free of the electrically insulating layer 104. In contrast to this, it may be exposed or may be covered with a saw frame foil or with an electrically conductive coupling structure.

Bonding the semiconductor chip 102 to the mounting base 1002 may be accomplished for example by soldering (for instance by soft soldering or Gold-Tin soldering) or by sintering.

Figure 20:
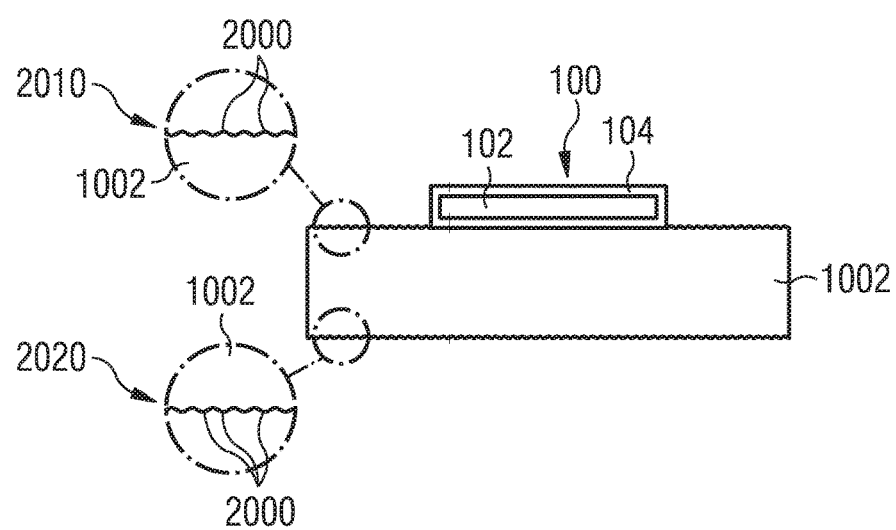

In order to obtain a structure shown in FIG. 20, the upper and lower main surfaces of the mounting base 1002, preferably made of copper, may be roughened in preparation of a subsequent galvanic deposition procedure (see rough surfaces 2000, as shown in details 2010, 2020. More generally, the exposed surface of the mounting base 1002 can be preconditioned for subsequent plating. Such a preconditioning may be the shown roughening procedure, or may additionally or alternatively involve cleaning of the surface.

Figure 21:
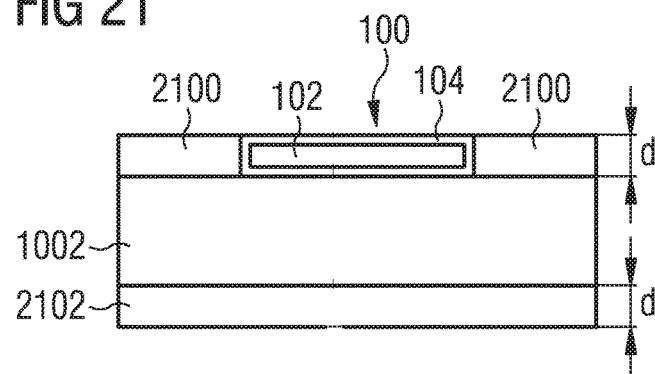

In order to obtain a structure shown in FIG. 21, only after completion of the mounting procedure, a lateral surrounding structure 2100 made of the same material (here copper) as the mounting base 1002 is formed. As a consequence of the presence of the already mounted insulated chip 100 on the mounting base 1002, a cavity is delimited in which the insulated chip 100 is laterally embedded. As can be taken from FIG. 21, the lateral surrounding structure 2100 is vertical in flush (i.e. at the same height level and forming a common planar surface) with the insulated chip 100. Highly advantageously, forming the lateral surrounding structure 2100 on the mounting base 1002 is accomplished by an additive procedure in form of galvanically plating. Simultaneously with the formation of the lateral surrounding structure 2100, the galvanic plating procedure also forms a counter structure 2102 on a main surface of the mounting base 1002 opposing a further main surface of the mounting base 1002 on which the lateral surrounding structure 2100 is arranged. Thus, a double-sided galvanic coating of the mounting base 1002 (here embodied as copper sheet) is carried out (copper plating). A vertical thickness, d, of each of the structures 2100, 2102 can be for example 150 µm. The structures 2100, 2102 can be formed by immersing the structure shown in FIG. 20 in a galvanic bath and by applying current. During this and other procedures, the electrically insulating layer 104 of parylene protects the semiconductor chip 102 with regard to the environment, from a mechanical and chemical point of view. The silicon material of the semiconductor chip 102 shall not come into direct contact with the galvanic chemistry as well as with copper material, because this might destroy the semiconductor chip 102. Thus, the parylene material of the electrically insulating layer 104 also serves as a powerful passivation of the semiconductor chip 102 with regard to harsh conditions in the environment.

Figure 22:
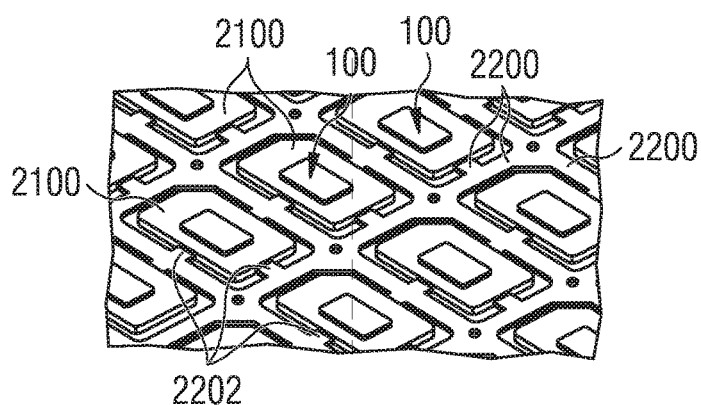

FIG. 22, shows a three-dimensional view of an arrangement of multiple components, one of which being shown in FIG. 21, connected via a bar and web structure 2200. Thus, the manufacturing procedure can be carried out as a batch. For singularising the individual components, it is sufficient to break the webs 2202, for example by punching.

Figure 23:
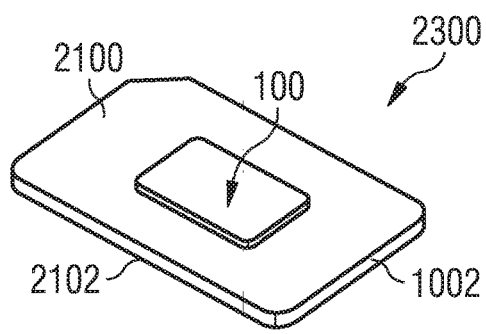

In order to obtain a structure shown in FIG. 23, the arrangement of FIG. 22 is singularized into a plurality of semifinished packages 2300, for instance by punching.

In order to obtain a structure shown in FIG. 24, the lateral surrounding structure 2100 and the insulated chip 100 on the mounting base 1002 are, i.e. a semifinished package 2300 as shown in FIG. 23 is, inserted into a laterally surrounding annular structure 2400 (for instance made of FR4 material which may comprise cured resin and glass fibers) being vertically in flush with the lateral surrounding structure 2100 and with the insulated chip 100. In other words, the singularized semifinished packages 2300 are inserted into cavities of a frame structure. With a thickness, D, of for instance 1.2 mm, the structure according to FIG. 24 is highly compact. The annular structure 2400 may be a printed circuit board with punched through holes in which the semifinished packages 2300 may be inserted in a batch manufacturing procedure.

In order to obtain a structure shown in FIG. 25, two top layers 2500, 2502 are arranged as planar sheets or foils on a top surface of the insulated chip 100 and the laterally surrounding structure 2100 and the lateral surrounding annular structure 2400. Correspondingly, two bottom layers 2504, 2506 are arranged as planar sheets or foils on a bottom surface of the counter structure 2102 and the lateral surrounding annular structure 2400. For connection, the elements of the so obtained sandwich or layer stack are connected to one another by lamination by applying mechanical pressure and thermal energy. Layers 2500, 2504 are electrically insulating, whereas layers 2502, 2506 are electrically conductive (for instance are made of copper). The procedure described referring to FIG. 25 results in an encapsulation of the semifinished package 2300 by lamination. Layers 2500, 2504 may be resin-rich prepreg layer, i.e. uncured resin with glass fibers therein. During the lamination, part of the resin flows into lateral recesses 2450 (compare FIG. 24) between the semifinished package 2300 and the annular structure 2400 and therefore fills empty gaps.

In order to obtain package 1200 shown in FIG. 26, vertical interconnect structures 2600 are formed in a top portion of the structure shown in FIG. 25 vertically extending through the electrically insulating top layer 2500 and through the electrically insulating layer 104 for providing an electric connection with the chip pads 106. More specifically, forming the vertical interconnect structures 2600 comprises laser drilling common access holes (see reference numeral 1100 in FIG. 11) extending through both the electrically insulating top layer 2500 and the electrically insulating layer 104 in a common procedure to thereby expose the chip pads 106. Thus, the electrically insulating layer 104 is advantageously made of a material being removable by laser drilling, such as parylene. Subsequently, the common access holes are filled with electrically conductive material such as copper. FIG. 26 shows that the semiconductor chip 102 is electrically contacted via correspondingly formed laser vias.

As a result of the manufacturing procedure described referring to FIG. 15 to FIG. 26, the package 1200 shown in FIG. 26 according to an exemplary embodiment of the invention is obtained. The package 1200 comprises the above described insulated chip 100 and an encapsulant 1000 encapsulating the insulated chip 100. When the package 1200 shown in FIG. 26 is manufactured in a batch procedure with multiple other packages 1200 (for instance when using a printed circuit board with punched through holes as annular structure 2400, wherein the semifinished packages 2300 are inserted in these through holes), such a structure first needs to be singularized into the individual packages 1200, for instance by sawing.

A cover 1004 of the encapsulated 1000 comprises the lateral surrounding structure 2100 consisting of copper which delimits the cavity in which the insulated chip 100 is embedded vertical in flush with the insulated chip 100. The cover 1004 also comprises the two described top layers 2500, 2502 covering the top surface of the insulated chip 100. The two top layers 2500, 2502 additionally cover a top surface of the lateral surrounding structure 2100. The two top layers 2500, 2502 comprise the lower electrically insulating top layer 2500 directly covering the top surface of the insulated chip 100 and being penetrated by the vertical interconnect structures 2600 providing for an electric connection with the chip pads 106. Moreover, the two top layers 2500, 2502 comprise upper electrically conductive layer 2502 directly covering the lower layer 2500 and being connected to the vertical interconnect structures 2600. The lateral surrounding structure 2100 is made of an electrically conductive material such as copper and is laterally surrounded by the electrically insulating annular structure 2400 being in flush with the lateral surrounding structure 2100.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a package, the method comprising:
    manufacturing an insulated chip by a method comprising:
        providing a semiconductor chip comprising at least one chip pad;
        surrounding at least part of the semiconductor chip with an electrically insulating layer;
    encapsulating at least part of the insulated chip by an encapsulant, wherein the method further comprises forming at least one common access hole extending through both the encapsulant and the electrically insulating layer in a common procedure to thereby expose the at least one chip pad.

2. The method according to claim 1, wherein the method further comprises filling the at least one common access hole with electrically conductive material.

3. The method according to claim 1, wherein the forming of the at least one common access hole comprises at least one of the group consisting of laser ablation, plasma processing, and chemically processing.

4. The method according to claim 1, wherein the method comprises mounting the insulated chip on a mounting base.

* * * * *